United States Patent
Leobandung

(10) Patent No.: US 11,761,903 B2
(45) Date of Patent: Sep. 19, 2023

(54) WAFER INSPECTION AND VERIFICATION

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 416 days.

(21) Appl. No.: 17/100,984

(22) Filed: Nov. 23, 2020

(65) Prior Publication Data

US 2022/0163460 A1    May 26, 2022

(51) Int. Cl.
G06F 9/455      (2018.01)
G01N 21/95     (2006.01)
G06F 30/20      (2020.01)

(52) U.S. Cl.
CPC ......... G01N 21/9501 (2013.01); G06F 30/20 (2020.01)

(58) Field of Classification Search
USPC ................... 716/50, 51, 52, 53, 54, 55, 111
See application file for complete search history.

(56) References Cited

U.S. PATENT DOCUMENTS

| | | | |
|---|---|---|---|
| 7,197,723 B2 | 3/2007 | Braun et al. | |
| 7,757,083 B2 | 7/2010 | Devadas et al. | |
| 7,838,873 B2 | 11/2010 | Clevenger et al. | |
| 8,877,525 B1 | 11/2014 | Leobandung et al. | |
| 9,576,914 B2 | 2/2017 | Li et al. | |
| 10,114,369 B2 | 10/2018 | Newell et al. | |
| 10,482,473 B2 | 11/2019 | Shaapur et al. | |
| 10,510,623 B2 | 12/2019 | Fang | |
| 2002/0130262 A1* | 9/2002 | Nakasuji | G01N 23/225 250/311 |

(Continued)

FOREIGN PATENT DOCUMENTS

| | | |
|---|---|---|
| WO | 2010046709 A1 | 4/2010 |
| WO | 2020120050 A1 | 6/2020 |

OTHER PUBLICATIONS

Plusquellic et al., "Detecting Hardware Trojans Using Delay Analysis," The Hardware Trojan War, Chapter 10, Springer, 2018, pp. 219-267.

(Continued)

*Primary Examiner* — Brian Ngo
(74) *Attorney, Agent, or Firm* — Eric W. Chesley

(57) ABSTRACT

A method can include obtaining a first reference image of a first wafer. The method can include obtaining a first image of the first wafer in a fabrication state. The first wafer can have a first verification structure. The method can include obtaining, when the first wafer is in the fabrication state, a first physical measurement. The first physical measurement can correspond to the first verification structure. The method can include determining that the first image matches the first reference image. The method can include obtaining an electrical parameter measurement corresponding to a verification structure of a received wafer in a post-fabrication state. The method can include calculating a physical parameter value based on the electrical parameter measurement. The method can include generating a verification response by comparing the physical parameter value to the first physical measurement.

24 Claims, 10 Drawing Sheets

(56) References Cited

U.S. PATENT DOCUMENTS

| | | | |
|---|---|---|---|
| 2005/0186776 A1 | 8/2005 | Borden | |
| 2010/0106447 A1* | 4/2010 | Yamada | G06T 7/41 |
| | | | 702/83 |
| 2013/0070078 A1* | 3/2013 | Takagi | G06T 7/001 |
| | | | 348/80 |
| 2014/0250518 A1 | 9/2014 | Schneider | |
| 2018/0144442 A1* | 5/2018 | Brauer | G06T 7/001 |
| 2019/0378260 A1* | 12/2019 | Brauer | G06T 7/001 |
| 2020/0003701 A1* | 1/2020 | Liao | H01L 21/67259 |

OTHER PUBLICATIONS

Mell et al., "The NIST Definition of Cloud Computing", Recommendations of the National Institute of Standards and Technology, Sep. 2011, 7 pages.
International Search Report and Written Opinion for Application PCT/EP2021/082207, dated Mar. 3, 2022, 12 pages.

* cited by examiner

WAFER INSPECTION AND VERIFICATION

BACKGROUND

The present disclosure relates to wafer fabrication, and more specifically, to wafer inspection and verification.

Wafer fabrication can include forming layers of various materials onto a wafer (e.g., a silicon wafer) to produce a plurality of electronic circuits on the wafer. The wafer can be separated into a set of dies, each of which can be integrated into various electronic devices.

SUMMARY

According to embodiments of the present disclosure, a method can include obtaining a first reference image of a first wafer. The method can include obtaining a first image of the first wafer in a fabrication state. In the fabrication state, the first wafer can have a number of fabrication layers that is less than a threshold number. The first wafer can have a first verification structure. The method can include obtaining, when the first wafer is in the fabrication state, a first physical measurement. The first physical measurement can correspond to the first verification structure. The method can include determining, at a first time, by comparing the first image to the first reference image, that the first image matches the first reference image. The method can include obtaining, at a second time subsequent to the first time, an electrical parameter measurement. The electrical parameter measurement can correspond to a verification structure of a received wafer in a post-fabrication state. In the post-fabrication state, the received wafer can have a second number of fabrication layers that is equal to the threshold number. The method can include calculating a physical parameter value based on the electrical parameter measurement. The method can include generating a verification response by comparing the physical parameter value to the first physical measurement.

A system and a computer program product corresponding to the above method are also included herein.

According to embodiments of the present disclosure, a method can include obtaining a first physical measurement. The first physical measurement can correspond to a first verification structure of a first wafer in a fabrication state. In the fabrication state, the first wafer can have a number of fabrication layers that is less than a threshold number. The method can include obtaining an electrical parameter measurement. The electrical parameter measurement can correspond to a verification structure of a received wafer in a post-fabrication state. In the post-fabrication state, the received wafer can have a second number of fabrication layers that is equal to the threshold number. The method can include calculating a physical parameter value based on the electrical parameter measurement. The method can include generating a verification response by comparing the physical parameter value to the first physical measurement.

Embodiments of the present disclosure can be illustrated as a device having a wafer. The wafer can have a first verification structure in a first region of the wafer. The first verification structure can include a first target component. The first verification structure can have a first measurable electrical parameter. The first measurable electrical parameter can correspond to a first physical characteristic of the first target component.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
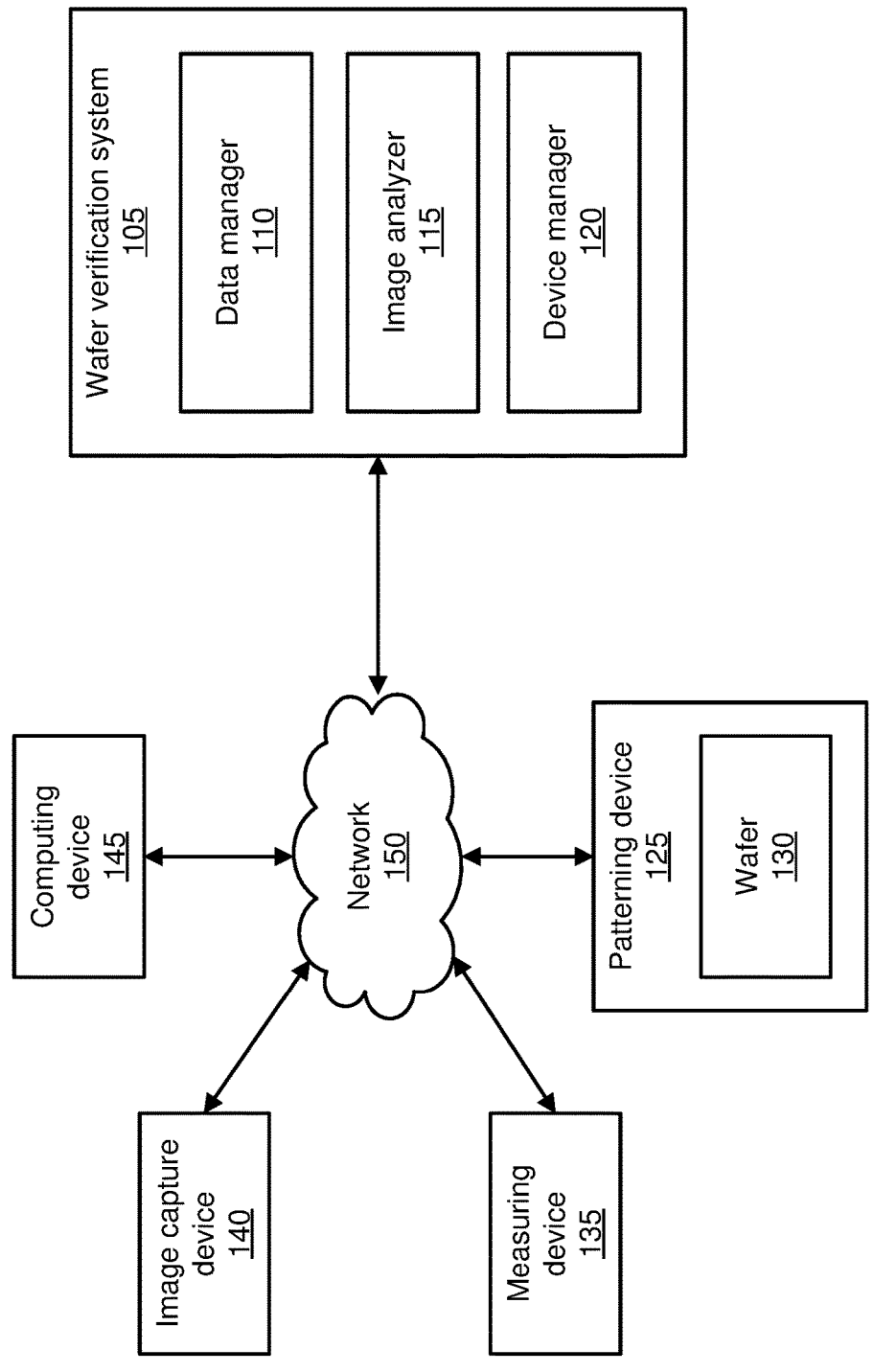
FIG. 1 depicts an example computing environment having a wafer verification system, in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to wafer fabrication; more particular aspects relate to wafer inspection and verification. While the present disclosure is not necessarily limited to such applications, various aspects of the disclosure may be appreciated through a discussion of various examples using this context.

Wafer fabrication can include forming layers of various materials onto a wafer (e.g., a silicon wafer) to produce a plurality of electronic circuits on the wafer. Such layers can be formed according to a design plan that includes detailed specifications (e.g., size, shape, location, and/or material composition) for each layer of the wafer. In some instances, a designing entity can submit such a design plan to a manufacturing entity for production. Such a submission can introduce one or more security risks. In an example, a malicious actor within the manufacturing entity could potentially modify the design plan to omit a functionality or add a functionality to one or more of the electronic circuits. The modification could result in compromise, failure, and/or destruction of the electronic circuits and/or devices that subsequently include the electronic circuits. Thus, it can be imperative that the designing entity have an effective means of confirming that each wafer is fabricated according to the detailed specifications.

Obtaining such a confirmation can present challenges. For example, circuit designs can include a large number of layers and features, such that a malicious design modification can be difficult to detect during a wafer inspection. Additionally, in some cases, a malicious actor can attempt to circumvent inspection procedures by substituting a modified or unauthentic wafer for an authentic wafer that has passed inspection.

To address these and other challenges, embodiments of the present disclosure include a wafer verification system. In some embodiments, the wafer verification system can perform layer-specific inspections of a wafer during fabrication. In some embodiments, following such layer-specific inspections, the wafer verification system can verify that a completed wafer is a wafer that underwent the layer-specific inspections during fabrication. More specifically, in some embodiments, to perform layer-specific inspections, the wafer verification system can obtain a set of images of a wafer in a fabrication state. The images can include fabrication layers formed on the wafer following one or more pattern transfer processes. In these embodiments, the wafer verification system can confirm that one or more layers of the wafer are formed according to predetermined specifications by comparing the set of images to a set of reference images. In some embodiments, the wafer verification system can obtain a physical measurement corresponding to a verification structure of the wafer when the wafer is in the fabrication state. In these embodiments, the wafer verification system can verify that a received, completed wafer is the same wafer from which the physical measurement was obtained. In some embodiments, the wafer verification system can perform such verification by comparing the physical measurement to a calculated physical parameter value corresponding to the verification structure. In some embodiments, the wafer verification system can perform such verification by comparing a plurality of such physical measurements to a plurality of calculated physical parameter values corresponding to respective verification structures of the wafer.

Accordingly, embodiments of the present disclosure can perform a thorough, accurate inspection and/or verification of a wafer. By comparing images of a plurality of fabrication layers of a wafer, embodiments of the present disclosure can identify, at a layer-specific level, deviations from predetermined wafer specifications. Thus, embodiments of the present disclosure can provide an increased likelihood of detecting design modifications to the wafer. Embodiments of the present disclosure that can verify/authenticate a wafer based on measurements of one or more verification structures can offer several advantages. For example, a verification structure of a first wafer can provide a unique physical measurement for the first wafer. Accordingly, embodiments of the present disclosure can verify the first wafer and/or distinguish the first wafer from a different, second wafer based on the unique physical measurement. Furthermore, embodiments of the present disclosure can include a plurality of verification structures in a plurality of wafer locations, and each verification structure can provide such a unique physical measurement. Thus, the verification structures, their locations, and/or the unique physical measurements they can provide can effectively serve as a fingerprint for the wafer. Embodiments of the present disclosure can identify and/or distinguish wafers based on such a fingerprint. Therefore, embodiments of the present disclosure can aid in detecting when a modified or unauthentic wafer is presented as an authentic wafer.

Turning to the figures, FIG. 1 illustrates a computing environment 100 that includes one or more of each of a wafer verification system 105, a patterning device 125, a measuring device 135, an image capture device 140, a computing device 145, and/or a network 150. In some embodiments, at least one wafer verification system 105, patterning device 125, measuring device 135, image capture device 140, and/or computing device 145 can exchange data with at least one other through the at least one network 150. One or more of each of the wafer verification system 105, patterning device 125, measuring device 135, image capture device 140, computing device 145, and/or network 150 can include a computer system, such as the computer system 401 discussed with respect to FIG. 4.

In some embodiments, the wafer verification system 105 can be included in software installed on a computer system of at least one of the patterning device 125, measuring device 135, image capture device 140, and/or computing device 145. For example, in some embodiments, the wafer verification system 105 can be included as a plug-in-in software component of software installed on the patterning device 125. The wafer verification system 105 can include program instructions implemented by a processor, such as a processor of the computing device 145, to perform one or more operations discussed with respect to FIG. 2.

In some embodiments, the wafer verification system 105 can include one or more modules, such as a data manager 110, image analyzer 115, and/or device manager 120. In some embodiments, the data manager 110, image analyzer 115, and/or device manager 120 can be integrated into a single module. In some embodiments, the data manager 110 can obtain, interpret, analyze, store, and/or initiate storage of data, such as reference data for a wafer 130. In some embodiments, the image analyzer 115 can obtain and analyze images of a wafer 130. In some embodiments the image analyzer 115 can include a set of neural networks and/or image analysis software to identify matches between images of a wafer 130 and reference images of the wafer 130. In some embodiments, the device manager 120 can transmit commands to the one or more patterning devices 125, measuring devices 135, the image capture devices 140, and/or computing devices 145. For example, in some embodiments, the device manager 120 can transmit a command to a measuring device 135 to obtain an electrical parameter measurement of a received wafer. In some embodiments, one or more of the data manager 110, image analyzer 115, and/or device manager 120 can include program instructions implemented by a processor, such as a processor of a computing device 145, to perform one or more operations discussed with respect to FIG. 2. For example, in some embodiments, the data manager 110 can include program instructions to perform operations 205 and 240-255, FIG. 2. In some embodiments, the image analyzer 115 can include program instructions to perform operations 210 and 220-230, FIG. 2. In some embodiments, the device manager 120 can include program instructions to perform operations 215 and 235, FIG. 2.

In some embodiments, the one or more patterning devices 125 can include a set of machines and/or equipment configured to perform processes such as photolithography, etching, deposition, and the like, to form fabrication layers onto the wafer 130. The wafer 130 can refer to a substrate upon which a set of electronic circuits can be formed. In some embodiments, the wafer 130 can be composed of a semiconductor material such as silicon.

In some embodiments, the one or more measuring devices 135 can include a set of machines and/or equipment configured to obtain physical measurements and/or electrical parameter measurements of a wafer 130. For example, in some embodiments, the one or more measuring devices 135 can include a precision ellipsometer configured to measure a thickness of a material formed on the wafer 130. In some embodiments, the one or more measuring devices 135 can be configured to measure registration accuracy between shapes printed in different fabrication levels or in the same fabrication level on the wafer 130. In some embodiments, the one or more measuring devices 135 can include a scanning electron microscope configured to measure dimensions associated with the wafer 130. In some embodiments, the one or more measuring devices can include a precision multimeter configured to obtain electrical parameter measurements of the wafer 130.

In some embodiments, the one or more image capture devices 140 can include a camera, scanning electron microscope, and the like. The one or more image capture devices can be configured to capture a set of images of a wafer 130. In some embodiments, the set of images can include images of one or more regions and/or fabrication layers of the wafer 130. In some embodiments, the patterning device 125, measuring device 135, and/or image capture device 140 can be integrated into a single device.

In some embodiments, the one or more computing devices 145 can include a computer or a server. For example, in some embodiments, the one or more computing devices 145 can include a computer of an entity, such as a fabrication facility, that operates patterning devices 125. The one or more computing devices 145 can be configured to store and/or process data, such as one or more thresholds, measurements, and/or images of the wafer 130. In some embodiments, the network 180 can be a wide area network (WAN), a local area network (LAN), the internet, or an intranet. In some embodiments, the network 180 can be substantially similar to, or the same as, cloud computing environment 50 discussed with respect to FIG. 5.

Figure 2:
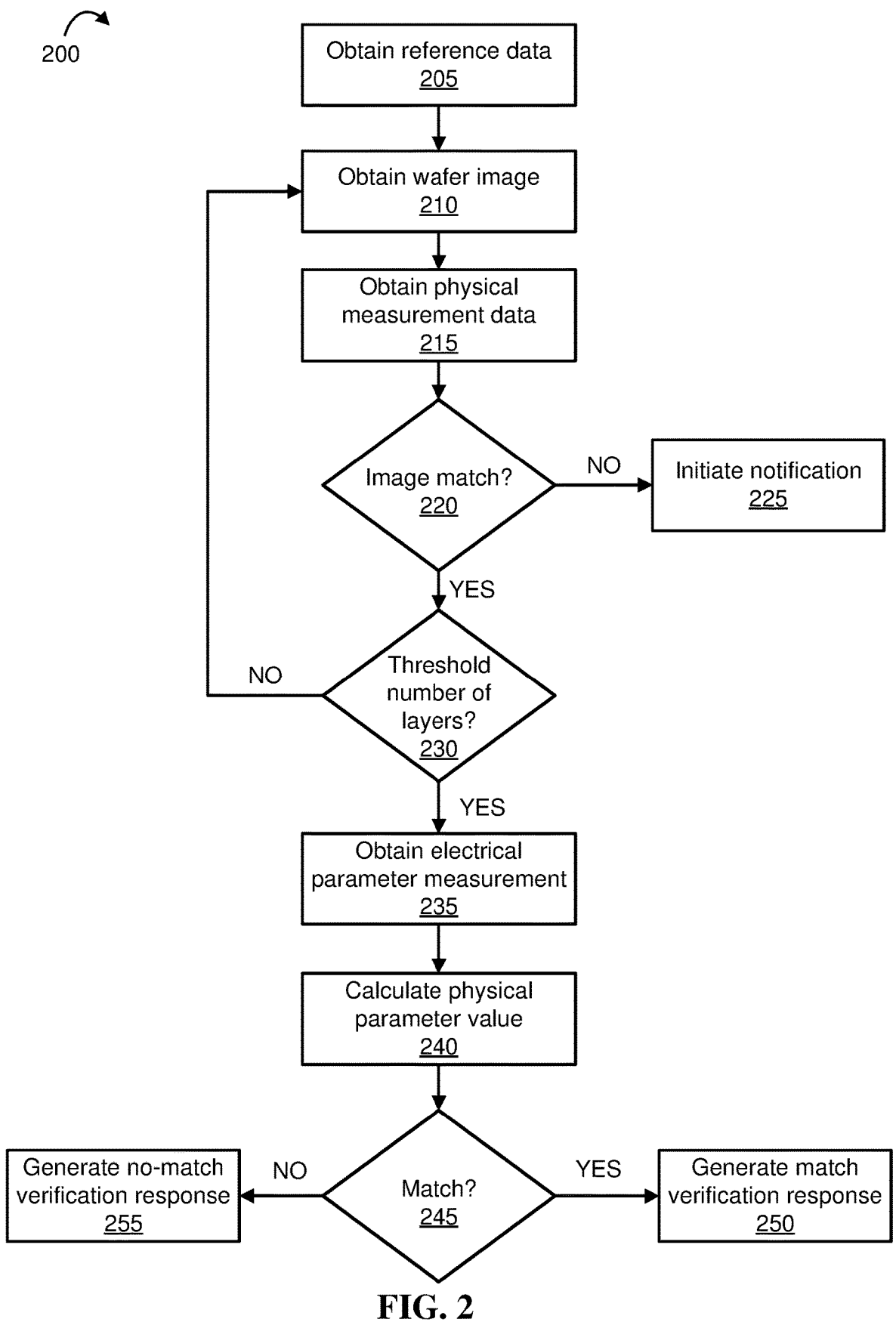
FIG. 2 depicts a flowchart of an example method for performing wafer inspection and verification, in accordance with embodiments of the present disclosure.

FIG. 2 illustrates a flowchart of an example method 200 for performing wafer inspection and verification, in accordance with embodiments of the present disclosure. Method 200 can be performed by a wafer verification system, such as the wafer verification system 105 discussed with respect to FIG. 1.

In operation 205, the wafer verification system can obtain reference data for one or more wafers. Reference data can include information regarding the fabrication of the one or more wafers. For example, in some embodiments, reference data can include design specifications for fabricating the one or more wafers. Such specifications can include information such as sizes, shapes, patterns, locations, orientations, and/or materials associated with features such as trenches, leads, conductors, insulators, pillars, and/or layers for forming electronic circuits on the one or more wafers. In some embodiments, reference data can include a set of reference images (e.g., digital photographs, scanning electron microscope images, and the like). In some embodiments, the set of reference images can include images from an electronic model of a wafer (e.g., a set of computer-aided design drawings of a wafer). The set of reference images can illustrate proper fabrication characteristics of a wafer, i.e., characteristics of a wafer fabricated according to the wafer's design specifications. For example, the reference images can illustrate characteristics such as proper sizes, shapes, patterns, locations, orientations, and/or materials of features such as trenches, leads, conductors, insulators, pillars, and/or layers for a wafer. As discussed in further detail below, the wafer verification system can employ such reference images to identify deviations from design specifications that occur during wafer fabrication.

In some embodiments, the set of reference images can include images of a wafer following one or more pattern transfer processes. For example, in some embodiments, design specifications can include a plurality of pattern transfer processes (e.g., etching, deposition, and/or doping processes) to form a threshold number of fabrication layers onto a wafer. In this example, the pattern transfer processes can form a total of fifty fabrication layers onto a wafer. In this example, the set of reference images can include images of one or more of the fifty fabrication layers formed from respective pattern transfer processes. In an example, the set of reference images can include images of a first wafer layer formed after etching a wafer and images of a second wafer layer formed after a subsequent deposition of a material onto the wafer. In some embodiments, the set of reference images can include one or more images for each fabrication layer of a wafer. In some embodiments, the set of reference images can include one or more images of predetermined fabrication layers of a wafer (e.g., images of first, third, and seventh fabrication layers of a wafer having a total of 10 fabrication layers). In some embodiments, the set of reference images can include images of an entire surface of a wafer and/or images of predetermined regions of the wafer. In some embodiments, such predetermined fabrication layers and/or predetermined regions can be selected by an entity such as a programmer or operator of the wafer verification system or by the wafer verification system itself (e.g., the wafer verification system can randomly select fabrication layers and/or regions whose images can be included in the set of reference images).

In operation 210, the wafer verification system can obtain one or more images of a wafer in a fabrication state. When a wafer is in a fabrication state, the wafer can have a number of fabrication layers that is less than a threshold number of layers. In some embodiments, the threshold number of layers can be a total number of fabrication layers associated with a completed wafer (e.g., a wafer that has completed all pattern transfer processes). For example, in some embodiments, a plurality of pattern transfer processes can form a total of 25 fabrication layers, or fabrication levels, onto a wafer. In this example, the wafer is in a fabrication state when the wafer has a first fabrication layer, second fabrication layer, third fabrication layer, and so on, until all 25 of the fabrication layers are formed onto the wafer. In some embodiments, the wafer can be in a post-fabrication state when the wafer has a number of fabrication layers that is equal to the threshold number of fabrication layers associated with a completed wafer. Thus, in the example above, the wafer can be in a post-fabrication state when the wafer has the total of 25 fabrication layers.

In some embodiments, operation 210 can include the wafer verification system obtaining a set of images of one or more fabrication layers of a wafer. The set of images can illustrate actual fabrication characteristics of a wafer. For example, the images can illustrate characteristics such as actual sizes, shapes, patterns, locations, orientations, and/or materials of features such as trenches, leads, conductors, insulators, pillars, and/or layers for a wafer. Such characteristics may or may not be in accordance with design specifications for the wafer. In some embodiments, the set of images can include images of an entire surface of a wafer and/or images of predetermined regions of the wafer. In some embodiments, such predetermined fabrication layers and/or predetermined regions can be selected by an entity such as a programmer or operator of the wafer verification system or by the wafer verification system itself (e.g., the wafer verification system can randomly select fabrication layers and/or regions whose images can be included in the set of images).

In some embodiments, operation 210 can include the wafer verification system obtaining a set of images from an image capture device (e.g., image capture device 140, FIG. 1). In some embodiments, operation 210 can include the wafer verification system commanding one or more image capture devices to capture one or more images of a wafer. For example, in some embodiments, the wafer verification system can command a digital camera to capture an image of a first region of a wafer and command a scanning electron microscope to capture 10 images of 10 different regions of a wafer. In some embodiments, the wafer verification system can obtain a set of images from a patterning device (e.g., patterning device 125, FIG. 1). In some embodiments, the wafer verification system can obtain a set of images stored on a computing device (e.g., computing device 145, FIG. 1).

In operation 215, the wafer verification system can obtain physical measurement data of a wafer in a fabrication state. Physical measurement data can include a measurement of at least one physical characteristic of the wafer. In some embodiments, such a physical characteristic can include a characteristic that can be visually perceived, such as a distance (e.g., length, width, height, and/or thickness), when the wafer is in a fabrication state. For example, in some embodiments, a width of a conductor formed on a fabrication layer can be visually perceived when the wafer is in a fabrication state, but the conductor can be obstructed by subsequent fabrication layers, such that it is less visible (e.g., not visible) in a post-fabrication state. Thus, in some embodiments, an optical measurement device can measure the width of the conductor when the wafer is in a fabrication state, but can be prevented, due to the reduced visibility of the conductor, from measuring such width when the wafer is in a post-fabrication state.

In some embodiments, the physical characteristic that is measured can correspond to a target component of a verification structure. A verification structure can refer to a structure of a wafer in a post-fabrication state. Such a verification structure can be configured to provide a measurable electrical parameter that corresponds to a physical characteristic of the target component. For example, continuing with the example above, a verification structure can include the conductor, formed on a fifth fabrication layer of a wafer, and a pair of conductive probe pads formed on a fiftieth, final fabrication layer of the wafer. In this example, the conductor can be the target component of the verification structure. As the target component, the conductor can have a physical characteristic (a width, in this example) that corresponds to a measurable electrical parameter (e.g., a resistance). The measurable electrical parameter can be measured across the pair of conductive probe pads formed on the fiftieth fabrication layer of the wafer (this aspect is discussed further with respect to operation 235, below). Continuing with this example, operation 215 can include the wafer verification system obtaining the width measurement of the conductor after the conductor is formed on the fifth fabrication layer and before its visibility is obstructed by subsequent fabrication layers.

In some embodiments, operative features (e.g., trenches, leads, conductors, insulators, and/or pillars) of the electronic circuits formed on a wafer can be components (e.g. target components) of a verification structure. In these embodiments, the verification structures can be integrated into an electronic circuit's design. In some embodiments the verification structures can be independent of an electronic circuit's design and can function solely for verification as discussed in this disclosure. For example, in some embodiments, a verification structure may not contribute to the operating performance of a computer chip formed on a wafer; rather, it may function solely to verify that a wafer is authentic when the wafer is in a post-fabrication state.

In some embodiments, operation 215 can include the wafer verification system obtaining physical measurement data from a measuring device (e.g., measuring device 135, FIG. 1). In some embodiments, operation 215 can include the wafer verification system commanding one or more measuring devices to obtain physical measurement data from a wafer. In some embodiments, an image capture device (e.g., image capture device 140, FIG. 1) and/or a patterning device (e.g., patterning device 135, FIG. 1) can be configured to obtain physical measurement data from a wafer. In these embodiments, operation 215 can include the wafer verification system obtaining physical measurement data from an image capture device and/or a patterning device. In some embodiments, operation 215 can include the wafer verification system commanding one or more image capture devices and/or patterning devices to obtain physical measurement data from a wafer.

By obtaining physical measurement data in operation 215, the wafer verification system can obtain a set of unique physical measurements of a wafer from one or more fabrication layers of the wafer. For example, in some embodiments, operation 215 can include the wafer verification system obtaining a first physical measurement of a first target component on a second fabrication layer of the wafer. In this example, the first physical measurement can be precisely measured (e.g., the first physical measurement can be measured on the order of nanometers). Thus, the first physical measurement can be unique in that the likelihood of a different wafer providing the same physical measurement for a respective, corresponding first target component can be low. Continuing with this example, operation 215 can further include the wafer verification system obtaining a second physical measurement of a second target component on a tenth fabrication layer of the wafer. Thus, in this example, the set of physical measurements (i.e., the first physical measurement together with the second physical measurement) can be unique in that the likelihood of a different wafer providing the same set of physical measurements for a respective first target component and second target component can be low. Therefore, in some embodiments, the physical measurement data obtained in operation 215 can effectively serve as a fingerprint that can facilitate identifying a wafer and/or distinguishing a wafer. Such identifying and/or distinguishing is discussed further with respect to operation 245, below.

In operation 220, the wafer verification system can compare one or more images of a wafer obtained in operation 210 to one or more corresponding reference images of the wafer obtained in operation 205 and determine whether one or more matches are present. In some embodiments, the wafer verification system can determine that an image of a wafer matches a corresponding reference image of the wafer when characteristics of the image have a threshold degree of similarity to characteristics of the corresponding reference image. For example, in some embodiments, the wafer verification system can determine a match is present when illustrated sizes, shapes, quantities, patterns, locations, orientations, and/or materials of features such as trenches, leads, conductors, insulators, pillars, and/or layers for a wafer have a threshold degree of similarity between an image of a wafer and a corresponding reference image of the wafer. In a more specific example, the wafer verification system can determine that a first orientation angle of a conductor illustrated in an image of a wafer matches a second orientation angle of a corresponding conductor illustrated in a reference image of the wafer when a percentage error between the first orientation angle and the second orientation angle does not exceed a threshold of 1%. In some embodiments, such a threshold degree of similarity can be selected by an entity such as a programmer or operator of the wafer verification system or by the wafer verification system itself. In some embodiments, operation 220 can include the wafer verification system employing image analysis technology and/or a set of neural networks to identify one or more matches between one or more images of a wafer and one or more reference images of the wafer. If the wafer verification system determines that the one or more images of the wafer match the one or more corresponding reference images of the wafer, then the wafer verification system can proceed to operation 230. Alternatively, if the wafer verification system determines that the one or more images of the wafer do not match the one or more corresponding reference images of the wafer, then the wafer verification system can proceed to operation 225.

In operation 225, the wafer verification system can initiate a notification indicating that one or more images of a wafer obtained in operation 210 do not match one or more corresponding reference images of the wafer obtained in operation 205. In some embodiments, the non-matching images can indicate that the wafer includes a malicious design modification. In some embodiments, such a notification can indicate that one or more fabrication layers of the wafer are not formed according to predetermined specifications for the wafer. In some embodiments, operation 225 can include the wafer verification system generating an alphanumeric text message, audible alert, and/or visual alert. In some embodiments, operation 225 can include the wafer verification system issuing a command to a device, such as a computing device, to generate and/or issue such a text message and/or alert.

In operation 230, the wafer verification system can determine whether a threshold number of fabrication layers is formed on the wafer. The threshold number of fabrication layers can be a total number of fabrication layers associated with a completed wafer (e.g., a wafer that has completed all pattern transfer processes). In some embodiments, operation 230 can include the wafer verification system analyzing reference data and/or images of the wafer to determine if the wafer is in a fabrication state. For example, in some embodiments, the wafer verification system can determine that a wafer is in a fabrication state by identifying differences between images of the wafer and reference images of the wafer in a post-fabrication state. In this example, such differences can indicate that one or more fabrication layers are to be formed onto the wafer before the wafer has the threshold number of fabrication layers. In some embodiments, operation 230 can include the wafer verification system obtaining information regarding additional layers to be formed on the wafer from a device such as a patterning device (e.g., patterning device 125, FIG. 1) or a computing device (e.g., computing device 145, FIG. 1). Based on such information, the wafer verification system can determine whether a threshold number of fabrication layers is formed on the wafer. If the wafer verification system determines that a threshold number of fabrication layers is formed on the wafer, then the wafer verification system can proceed to operation 235. Alternatively, if the wafer verification system determines that a threshold number of fabrication layers is not formed on the wafer, then the wafer verification system can proceed to operation 210.

In operation 235, the wafer verification system can obtain a set of electrical parameter measurements for a received wafer. A "received wafer" can refer to a wafer in a post-fabrication state that is to be verified or authenticated. In some embodiments, the received wafer can be received by a measuring device (e.g., measuring device 135, FIG. 1) that can obtain the set of electrical parameter measurements from the received wafer and transmit such measurements to the wafer verification system. In some embodiments, verifying the received wafer can include identifying the received wafer as a wafer that was inspected in operation 220. In some embodiments, verifying the received wafer can include distinguishing the received wafer from a wafer that was inspected in operation 220. As discussed below, the wafer verification system can use the set of electrical parameter measurements to verify the received wafer.

In an example scenario, at a first time, the wafer verification system can inspect a first wafer by image comparison, as discussed with respect to operation 220. Additionally at the first time, the wafer verification system can obtain a physical measurement corresponding to a verification structure, as discussed with respect to operation 215. Continuing with this example, at a second time subsequent to the first time, a measuring device can receive a wafer to be verified. The measuring device can measure an electrical parameter (e.g., a capacitance, resistance, current, and the like) of a verification structure on the received wafer. Afterward, in operation 235, the wafer verification system can obtain the electrical parameter measurement from the measuring device.

In operation 240, the wafer verification system can calculate a set of physical parameter values based on the set of electrical parameter measurements obtained in operation 235. In some embodiments, a physical parameter value calculated in operation 240 can correspond to a physical measurement of a target structure. For example, in some embodiments, operation 235 can include the wafer verification system obtaining a capacitance measurement of a verification structure of a received wafer. In this example, the capacitance measurement can correspond to a thickness of an electrical insulator of the verification structure. Thus, in this example, operation 240 can include the wafer verification system employing known scientific principles to calculate the thickness of the electrical insulator.

In operation 245, the wafer verification system can compare one or more physical parameter values calculated in operation 240 to one or more physical measurements obtained in operation 215 to determine if one or more matches are present. The presence of a match can verify that a received wafer had a physical measurement obtained by the wafer verification system in operation 215. Accordingly, the presence of a match can indicate that the received wafer was inspected by the wafer verification system in operation 220. The lack of a match can indicate that the received wafer did not have a physical measurement obtained by the wafer verification system in operation 215. Accordingly, the lack of a match can indicate that the received wafer was not inspected by the wafer verification system in operation 220. If the wafer verification system determines that one or more of the physical parameter values matches one or more of the physical measurements, then the wafer verification system can proceed to operation 250. Alternatively, if the wafer verification system determines that one or more of the physical parameter values do not match one or more of the physical measurements, then the wafer verification system can proceed to operation 255.

In operation 250, the wafer verification system can generate a match verification response. The match verification response can indicate that a received wafer is a wafer that was inspected by the wafer verification system in operation 220. In some embodiments, operation 250 can include the wafer verification system generating an alphanumeric text message, audible alert, and/or visual alert to indicate the match. In some embodiments, operation 250 can include the wafer verification system issuing a command to a device, such as a computing device, to generate and/or issue such a text message and/or alert.

In operation 255, the wafer verification system can generate a no-match verification response. The no-match verification response can indicate that a received wafer is not a wafer that was inspected by the wafer verification system in operation 220. In some embodiments, operation 255 can include the wafer verification system generating an alphanumeric text message, audible alert, and/or visual alert to indicate the lack of a match. In some embodiments, operation 255 can include the wafer verification system issuing a command to a device, such as a computing device, to generate and/or issue such a text message and/or alert.

Figure 3A:
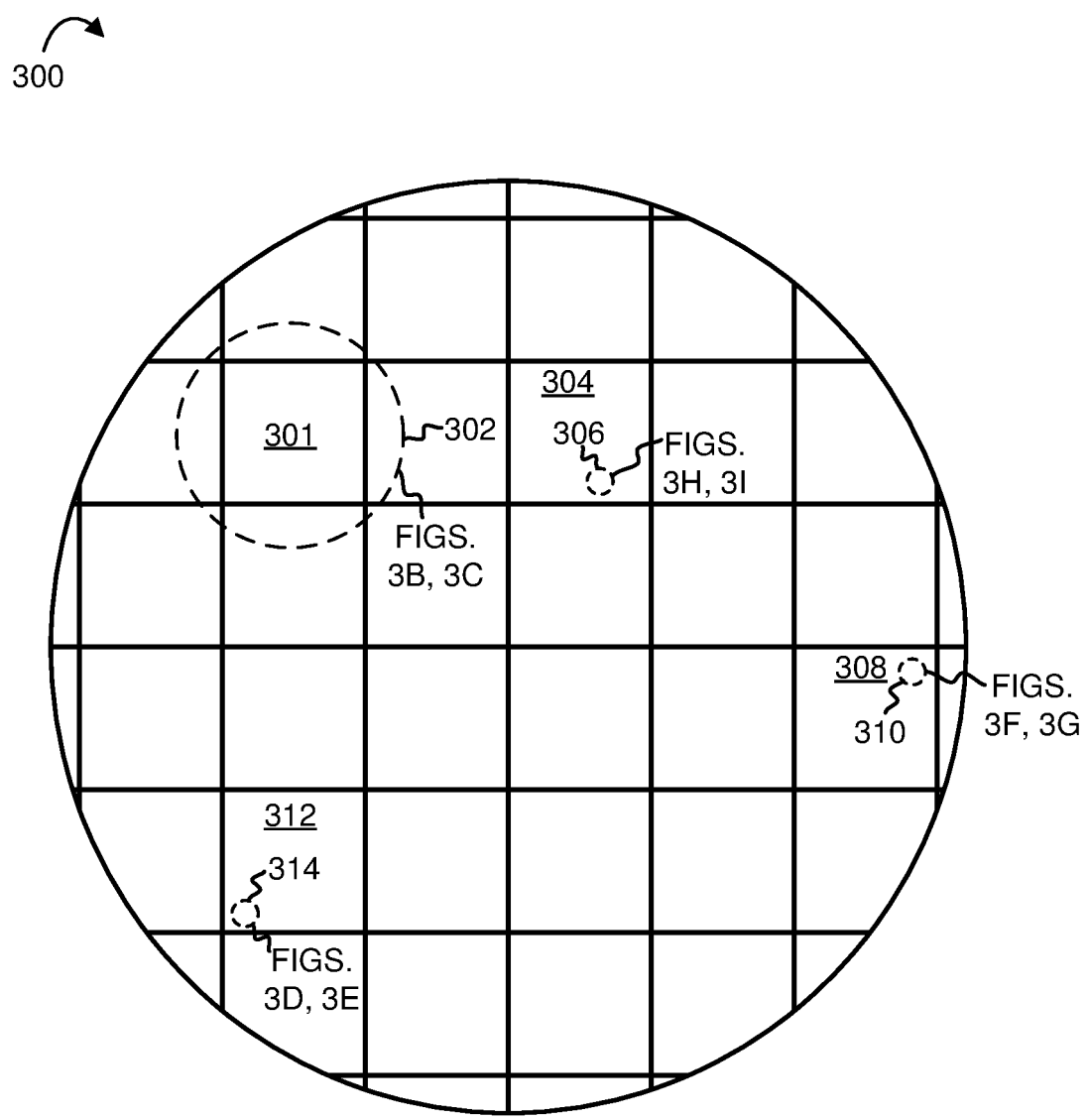
FIG. 3A depicts a top view of an example wafer, in accordance with embodiments of the present disclosure.

FIG. 3A depicts a top view of an example wafer 300, in accordance with embodiments of the present disclosure. The wafer 300 includes dies 301, 304, 308, 312. Die 301 is located in a first region 302 of the wafer 300. Die 312 includes a second region 314 where the verification structure discussed with respect to FIGS. 3D and 3E is located. Die 308 includes a third region 310 where the verification structure discussed with respect to FIGS. 3F and 3G is located. Die 304 includes a fourth region 306 where the verification structure discussed with respect to FIGS. 3H and 3I is located.

Figure 3B:
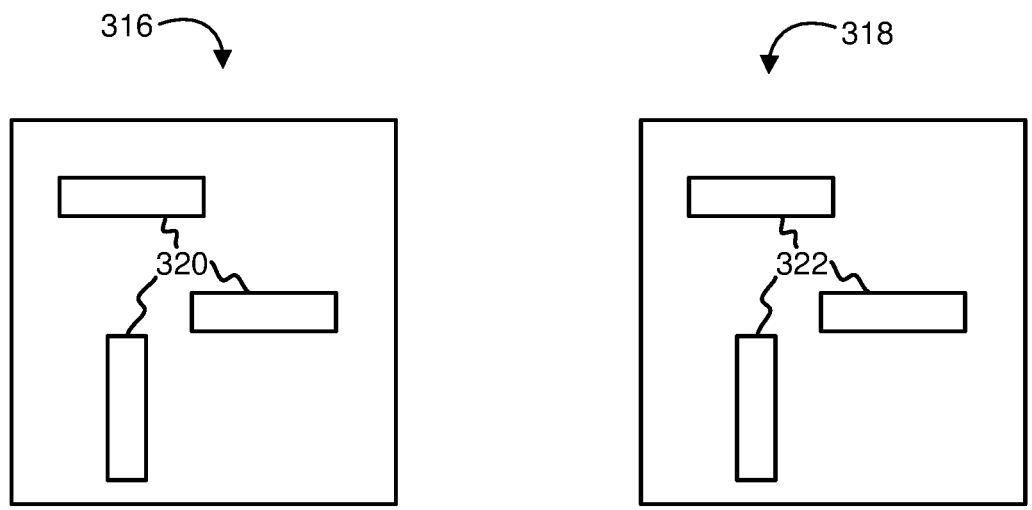
FIG. 3B depicts top views of an example die of the wafer of FIG. 3A and a corresponding reference image, each having a first fabrication layer, in accordance with embodiments of the present disclosure.

FIG. 3B depicts an image 316 of die 301 and a reference image 318 corresponding to the die 301. The image 316 can be obtained by a wafer verification system in operation 210, FIG. 2. The reference image 318 can be obtained by a wafer verification system in operation 205, FIG. 2. Both the image 316 and the reference image 318 depict the region 302 the wafer 300 in a fabrication state. The image 316 depicts a set of conductors 320 of a first fabrication layer formed on the wafer 300. In some embodiments, the conductors 320 can be operative features of an electronic circuit design. The reference image 318 depicts a set of reference conductors 322 of a first reference fabrication layer of the wafer 300. The reference conductors 322 can illustrate the proper characteristics for the set of conductors 320. For example, the reference conductors 322 can have sizes that are consistent with the design specifications for the wafer 300. Thus, in this example, a wafer verification system can compare the image 316 to the reference image 318 and determine that the images match. In this example, the wafer verification system can determine such a match based on a percentage error between the sizes of the conductors 320 and the sizes of the reference conductors 322 not exceeding a threshold of 5%.

Figure 3C:
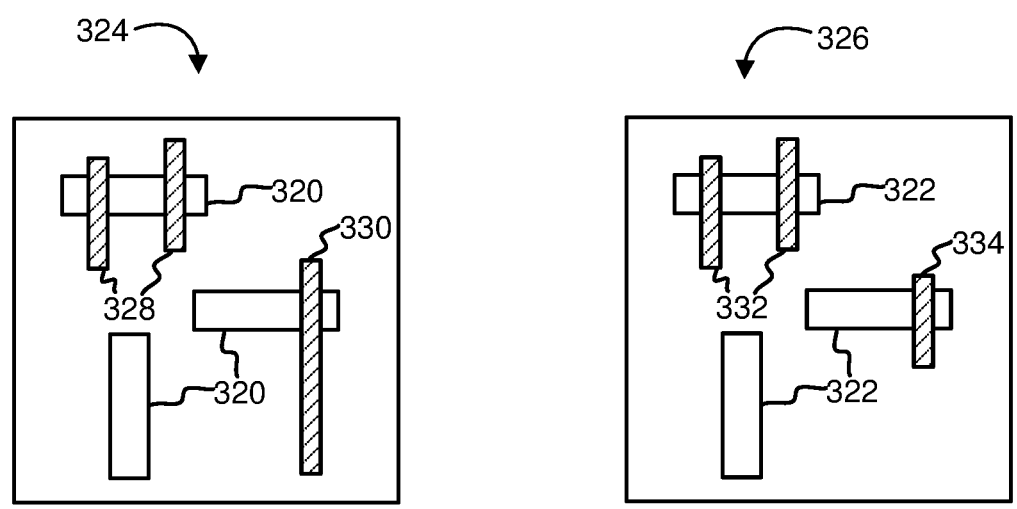
FIG. 3C depicts top views of the example die and the corresponding reference image of FIG. 3B, each having the first fabrication layer and a second fabrication layer, in accordance with embodiments of the present disclosure.
Figure 3D:
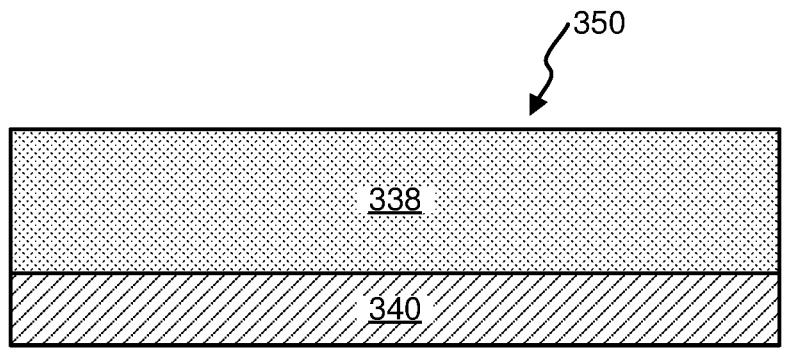
FIG. 3D depicts a section view of an example target component in a region of the wafer of FIG. 3A, in accordance with embodiments of the present disclosure.
Figure 3E:
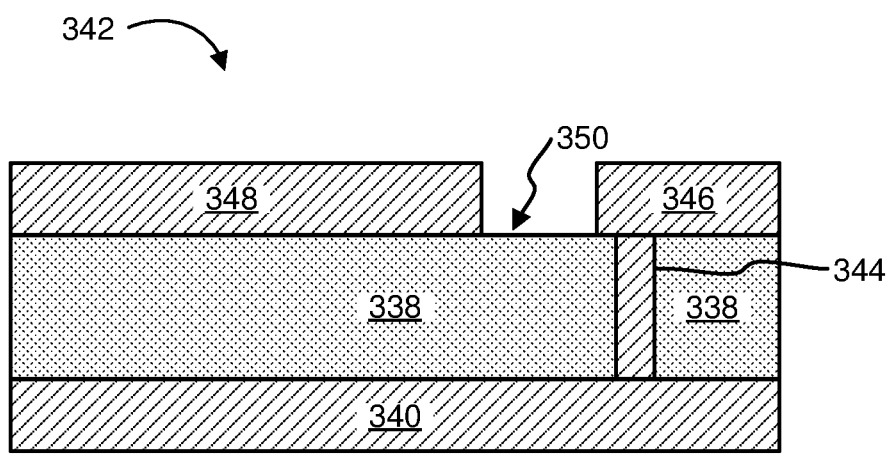
FIG. 3E depicts a section view of an example verification structure that includes the target component of FIG. 3D, in accordance with embodiments of the present disclosure.
Figure 3F:
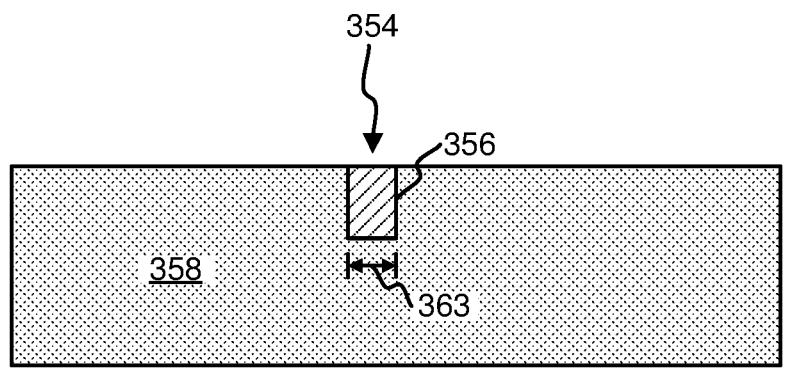
FIG. 3F depicts a section view of an example target component in a region of the wafer of FIG. 3A, in accordance with embodiments of the present disclosure.
Figure 3G:
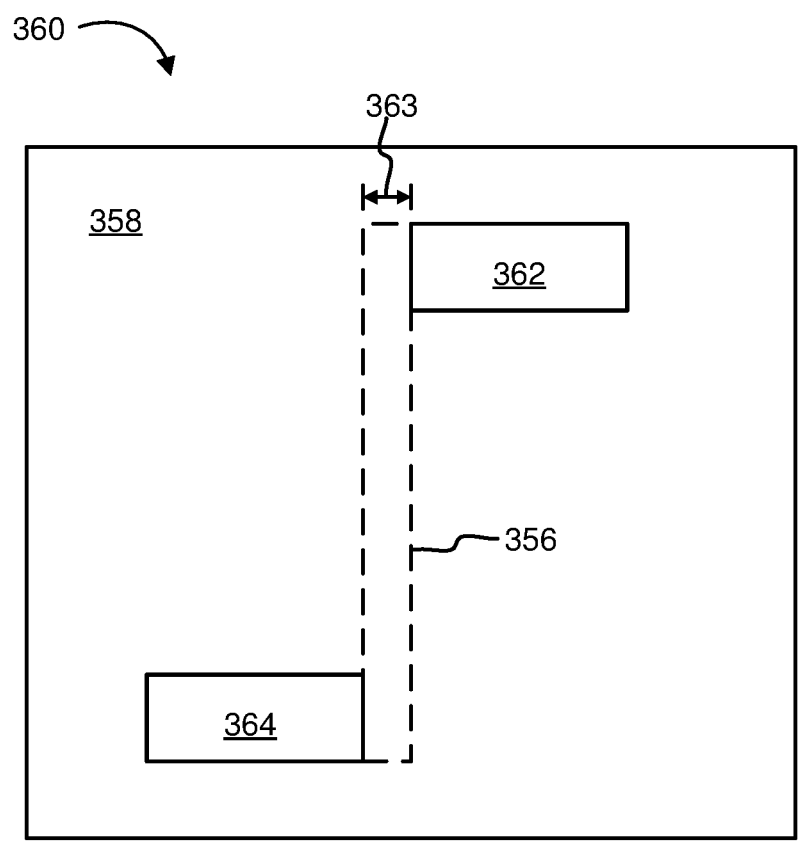
FIG. 3G depicts a top view of an example verification structure that includes the target component of FIG. 3F, in accordance with embodiments of the present disclosure.
Figure 3H:
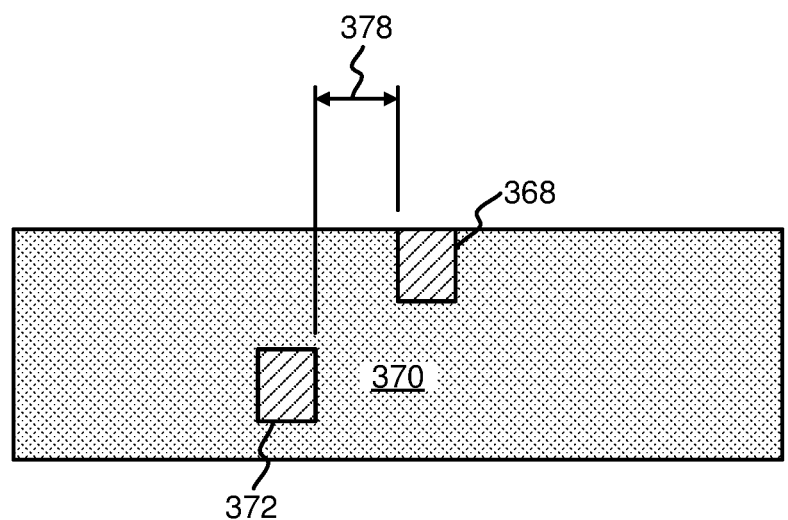
FIG. 3H depicts a section view of an example target component in a region of the wafer of FIG. 3A, in accordance with embodiments of the present disclosure.
Figure 3I:
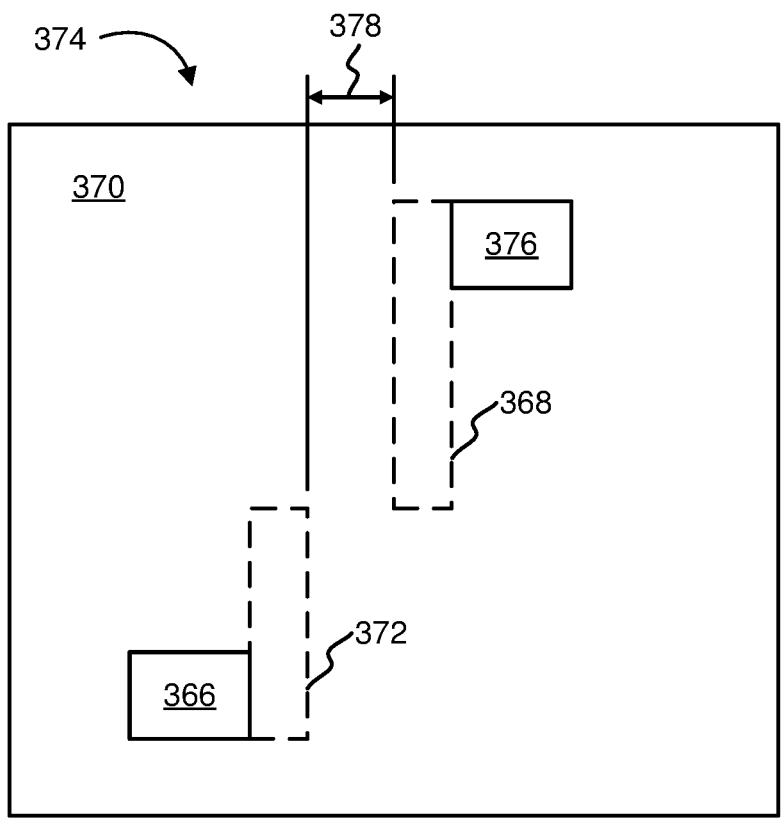
FIG. 3I depicts a top view of an example verification structure that includes the target component of FIG. 3H, in accordance with embodiments of the present disclosure.

FIG. 3C depicts an image 324 and a reference image 326 corresponding, respectively, to image 316 and reference image 318. The image 324 can be obtained by a wafer verification system in operation 210, FIG. 2. The reference image 326 can be obtained by a wafer verification system in operation 205, FIG. 2. The image 324 depicts the region 302 of the wafer 300 after a set of conductors 328, 330 of a second fabrication layer is formed on the wafer 300. In some embodiments, the conductors 328 can be operative features of an electronic circuit design. The reference image 326 depicts a set of reference conductors 332, 334 of a second reference fabrication layer of the wafer 300. Similar to the reference conductors 322, the reference conductors 332, 334 can illustrate the proper characteristics for the set of conductors 328, 330. For example, the reference conductors 332, 334 can have lengths that are consistent with the design specifications for the wafer 300. Thus, in this example, a wafer verification system can compare the image 324 to the reference image 326 and determine that the images do not match. In this example, the wafer verification system can determine the lack of the match based on a percentage error between the length of conductor 330 and the length of reference conductor 334 exceeding a threshold of 2%. In this example, the non-matching images can indicate that the wafer 300 has a malicious design modification to the second fabrication layer of the wafer 300.

FIG. 3D depicts a section view of an example target component 338 in region 314 of the wafer 300, in accordance with embodiments of the present disclosure. The target component 338 can be an insulator formed onto a conductive layer 340 of the wafer 300. In FIG. 3D, the wafer 300 is in a fabrication state; thus, the target component 338 can have a top surface 350 that is unobstructed by subsequent fabrication layers. Since the top surface 350 of the target component 338 is unobstructed, a wafer verification system can obtain a physical measurement (e.g., a thickness measurement) of the target component 338. The wafer verification system can obtain the physical measurement as described with respect to operation 215, FIG. 2. In some embodiments, the wafer verification system can employ an ellipsometer to obtain the physical measurement.

FIG. 3E depicts a section view of an example verification structure 342 that includes the target component 338, in accordance with embodiments of the present disclosure. In FIG. 3E, the wafer 300 is in a post-fabrication state. Thus, the verification structure 342 includes the target component 338 formed onto a conductive layer 340 as well as a conductor 344, and probe pads 348, 346. The probe pads 348, 346 are included in a fabrication layer that is formed above the fabrication layer that includes the target component 338. Additionally, when the wafer 300 is in the post-fabrication state, the top surface 350 of the target component 338 can be obstructed; thus, a physical measurement of the target component 338 by a device such as an ellipsometer may not be available. However, the verification structure 342 can be configured to provide an electrical parameter measurement (e.g., a capacitance between probe pads 348 and 346). By employing known scientific principles, a wafer verification system can calculate the thickness of the target component 338 based on such capacitance, as described with respect to operation 240, FIG. 2. Using the calculated thickness, the wafer verification system can verify a wafer, as described with respect to operation 245, FIG. 2.

FIG. 3F depicts a section view of an example target component 356 in region 310 of the wafer 300, in accordance with embodiments of the present disclosure. The target component 356 can be a conductor formed onto an insulator 358 of the wafer 300. In FIG. 3F, the wafer 300 is in a fabrication state; thus, the target component 356 can have a top surface 354 that is visible. Since the top surface 354 is visible, a wafer verification system can obtain a physical measurement (e.g., a width 363) of the target component 356.

FIG. 3G depicts a top view of an example verification structure 360 that includes the target component 356, in accordance with embodiments of the present disclosure. In FIG. 3G, the wafer 300 is in a post-fabrication state. Thus, the target component 356 is covered by a subsequent layer of the insulator 358 and is not visible. In this example, the verification structure 360 can be configured to provide an electrical parameter measurement (e.g., a resistance between probe pads 362 and 364). By employing known scientific principles, a wafer verification system can calculate the width 363 of the target component 356 based on such resistance, as described with respect to operation 240, FIG. 2. Using the calculated width 363, the wafer verification system can verify a wafer, as described with respect to operation 245, FIG. 2.

FIG. 3H depicts a section view of an example target component 378 in region 306 of the wafer 300, in accordance with embodiments of the present disclosure. The target component 378 can be a width of an insulator 370 between a first conductor 372 and a second conductor 368. In FIG. 3H the wafer 300 is in a fabrication state; thus, during one or more pattern transfer processes, the target component 378 can have been visible. Accordingly, a wafer verification system could obtain the target component 378 width as a physical measurement.

FIG. 3I depicts a top view of an example verification structure 374 that includes the target component 378, in accordance with embodiments of the present disclosure. In FIG. 3I, the wafer 300 is in a post-fabrication state; thus, the target component 378 is not visible due to a subsequent layer of the insulator 370. In this example, the verification structure 374 can be configured to provide an electrical parameter measurement (e.g., a leakage current or capacitance between probe pads 366 and 376). By employing known scientific principles, a wafer verification system can calculate the width of the target component 378 based on such leakage current, as described with respect to operation 240, FIG. 2. Using the calculated width, the wafer verification system can verify a wafer, as described with respect to operation 245, FIG. 2.

In some embodiments, the wafer 300 can include at least one of the verification structures described with respect to FIGS. 3A and 3D-3I. In some embodiments, the wafer 300 can include verification structures having components (e.g., target components) in different fabrication layers of the wafer 300. For example, in some embodiments, a target component for a first verification structure can be formed in a tenth fabrication layer of the wafer 300, and a target component for a second verification structure can be formed in a thirtieth fabrication layer of the wafer 300, where the thirtieth layer is formed above, or on top of, the tenth fabrication layer. In some embodiments, probe pads of one or more verification structures of the wafer 300 can be formed in the same layer of the wafer 300.

Figure 4:
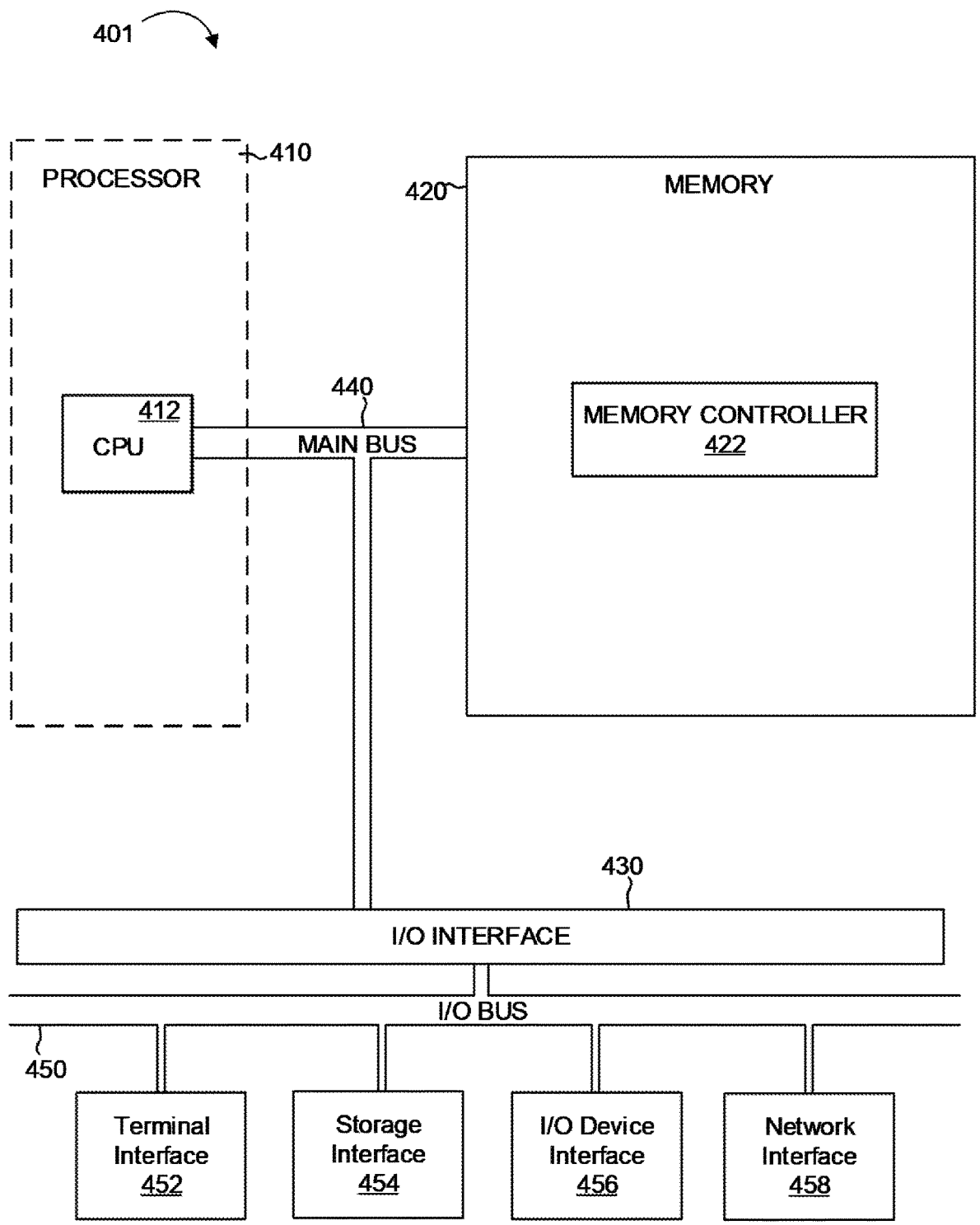
FIG. 4 depicts the representative major components of a computer system that can be used in accordance with embodiments of the present disclosure.

FIG. 4 depicts the representative major components of an exemplary Computer System 401 that can be used in accordance with embodiments of the present disclosure. The particular components depicted are presented for the purpose of example only and are not necessarily the only such variations. The Computer System 401 can comprise a Processor 410, Memory 420, an Input/Output Interface (also referred to herein as I/O or I/O Interface) 430, and a Main Bus 440. The Main Bus 440 can provide communication pathways for the other components of the Computer System 401. In some embodiments, the Main Bus 440 can connect to other components such as a specialized digital signal processor (not depicted).

The Processor 410 of the Computer System 401 can be comprised of one or more CPUs 412. The Processor 410 can additionally be comprised of one or more memory buffers or caches (not depicted) that provide temporary storage of instructions and data for the CPU 412. The CPU 412 can perform instructions on input provided from the caches or from the Memory 420 and output the result to caches or the Memory 420. The CPU 412 can be comprised of one or more circuits configured to perform one or methods consistent with embodiments of the present disclosure. In some embodiments, the Computer System 401 can contain multiple Processors 410 typical of a relatively large system. In other embodiments, however, the Computer System 401 can be a single processor with a singular CPU 412.

The Memory 420 of the Computer System 401 can be comprised of a Memory Controller 422 and one or more memory modules for temporarily or permanently storing data (not depicted). In some embodiments, the Memory 420 can comprise a random-access semiconductor memory, storage device, or storage medium (either volatile or non-volatile) for storing data and programs. The Memory Controller 422 can communicate with the Processor 410, facilitating storage and retrieval of information in the memory modules. The Memory Controller 422 can communicate with the I/O Interface 430, facilitating storage and retrieval of input or output in the memory modules. In some embodiments, the memory modules can be dual in-line memory modules.

The I/O Interface 430 can comprise an I/O Bus 450, a Terminal Interface 452, a Storage Interface 454, an I/O Device Interface 456, and a Network Interface 458. The I/O Interface 430 can connect the Main Bus 440 to the I/O Bus 450. The I/O Interface 430 can direct instructions and data from the Processor 410 and Memory 420 to the various interfaces of the I/O Bus 450. The I/O Interface 430 can also direct instructions and data from the various interfaces of the I/O Bus 450 to the Processor 410 and Memory 420. The various interfaces can comprise the Terminal Interface 452, the Storage Interface 454, the I/O Device Interface 456, and the Network Interface 458. In some embodiments, the various interfaces can comprise a subset of the aforementioned interfaces (e.g., an embedded computer system in an industrial application may not include the Terminal Interface 452 and the Storage Interface 454).

Logic modules throughout the Computer System 401—including but not limited to the Memory 420, the Processor 410, and the I/O Interface 430—can communicate failures and changes to one or more components to a hypervisor or operating system (not depicted). The hypervisor or the operating system can allocate the various resources available in the Computer System 401 and track the location of data in Memory 420 and of processes assigned to various CPUs 412. In embodiments that combine or rearrange elements, aspects of the logic modules' capabilities can be combined or redistributed. These variations would be apparent to one skilled in the art.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy, and compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
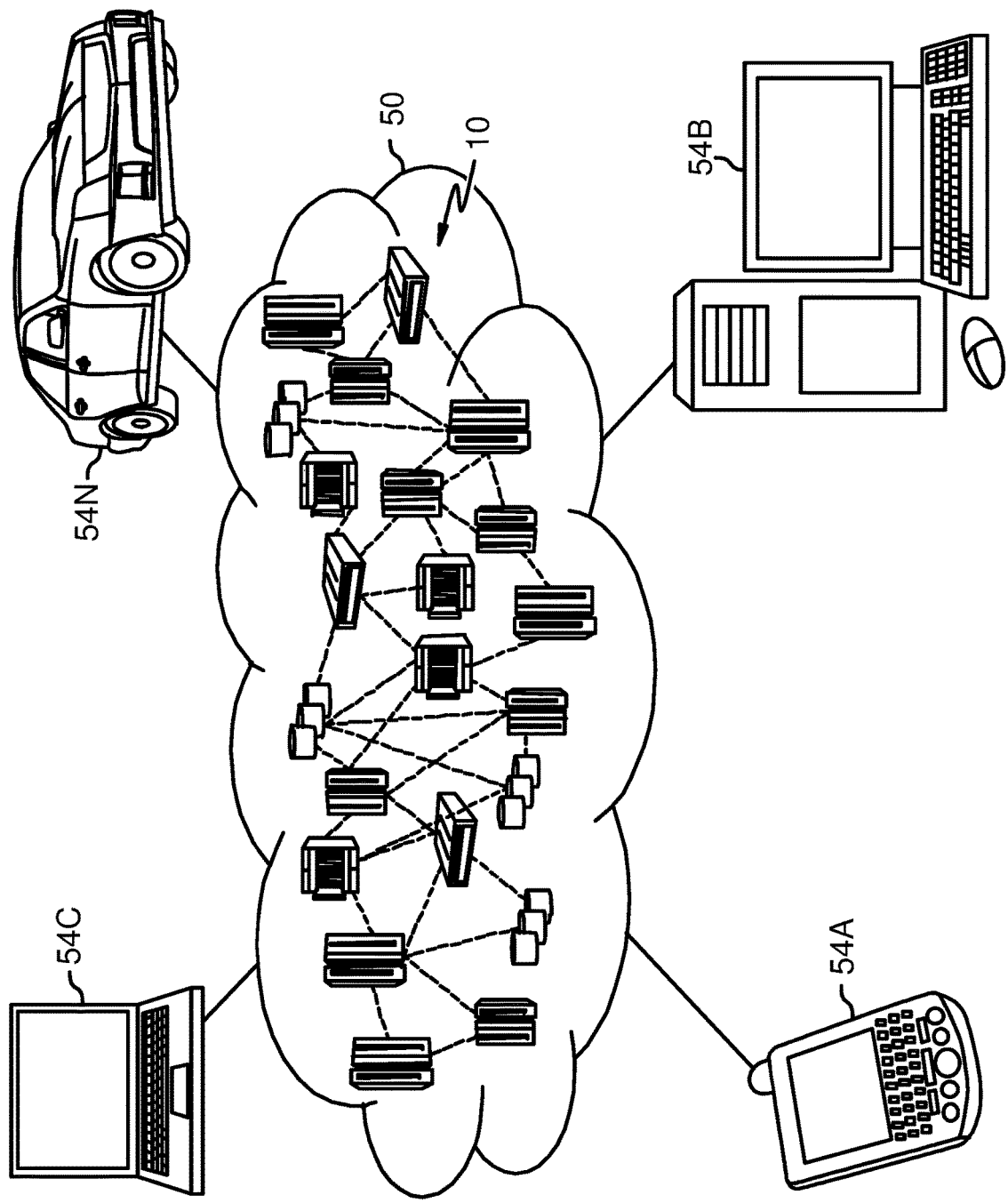
FIG. 5 depicts a cloud computing environment according to embodiments of the present disclosure.

Referring now to FIG. 5, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N can communicate. Nodes 10 can communicate with one another. They can be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Figure 6:
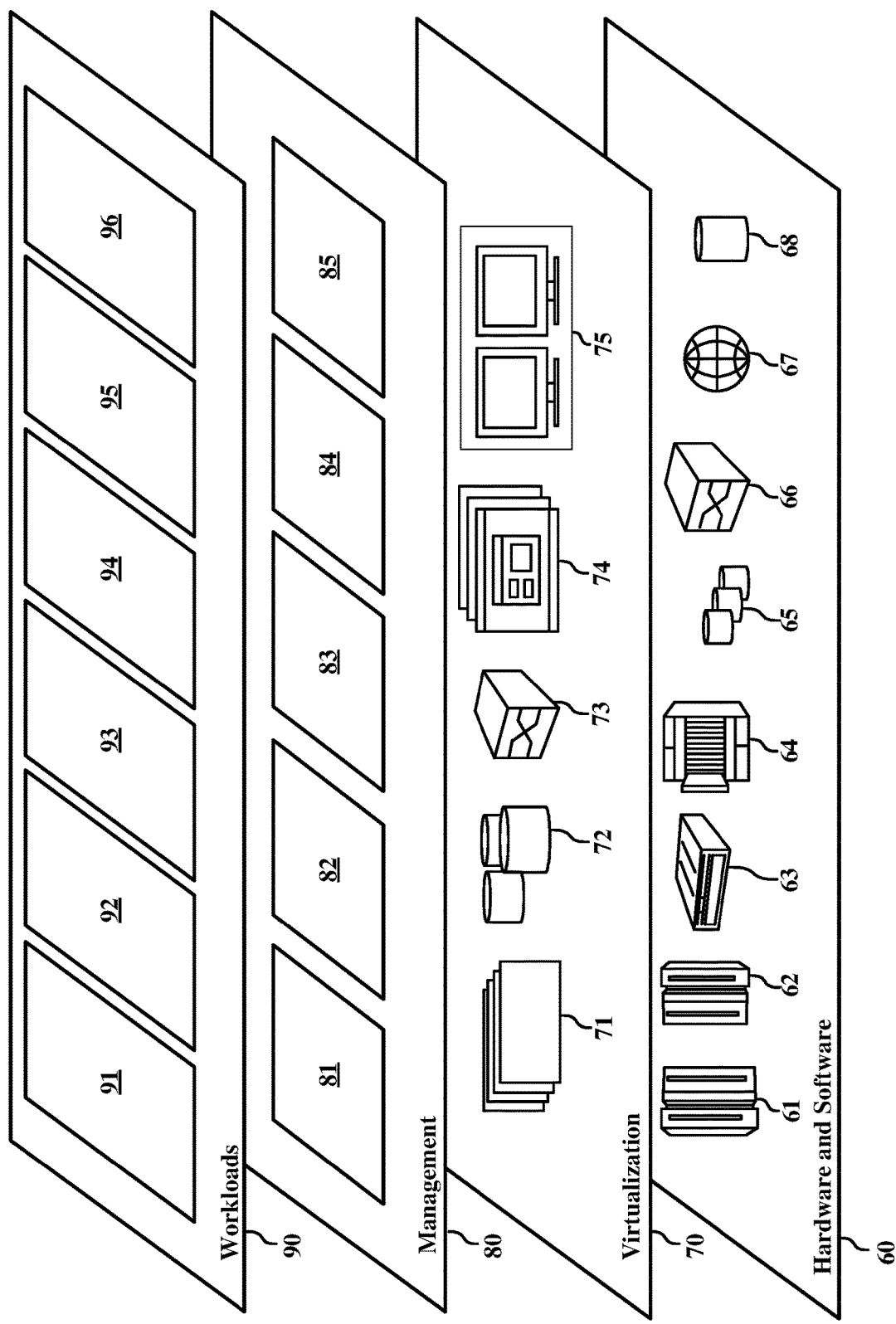
FIG. 6 depicts abstraction model layers according to embodiments of the present disclosure.

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities can be provided: virtual servers 71; virtual storage 72; virtual networks 73, including virtual private networks; virtual applications and operating systems 74; and virtual clients 75.

In one example, management layer 80 can provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources can comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment can be utilized. Examples of workloads and functions which can be provided from this layer include: mapping and navigation 91; software development and lifecycle management 92; virtual classroom education delivery 93; data analytics processing 94; transaction processing 95; and inspection/verification logic 96.

As discussed in more detail herein, it is contemplated that some or all of the operations of some of the embodiments of methods described herein can be performed in alternative orders or may not be performed at all; furthermore, multiple operations can occur at the same time or as an internal part of a larger process.

The present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method comprising:
   obtaining a first reference image of a first wafer;
   obtaining a first image of the first wafer in a fabrication state,
   wherein in the fabrication state, the first wafer has a number of fabrication layers that is less than a threshold number;
   wherein the first wafer has a first verification structure;
   obtaining, when the first wafer is in the fabrication state, a first physical measurement corresponding to the first verification structure;
   determining, at a first time, by comparing the first image to the first reference image, that the first image matches the first reference image;
   obtaining, at a second time subsequent to the first time, an electrical parameter measurement corresponding to a verification structure of a received wafer in a post-fabrication state;
   wherein in the post-fabrication state, the received wafer has a second number of fabrication layers that is equal to the threshold number;
   calculating a physical parameter value based on the electrical parameter measurement; and
   generating a verification response by comparing the physical parameter value to the first physical measurement.

2. The computer-implemented method of claim 1, further comprising:
   determining, based on the comparing the physical parameter value to the first physical measurement, that the physical parameter value matches the first physical measurement,
   wherein in response to the determining that the physical parameter value matches the first physical measurement, the generating the verification response comprises indicating that the received wafer is the first wafer in the post-fabrication state,
   wherein in the post-fabrication state, the first wafer has the second number of fabrication layers that is equal to the threshold number.

3. The computer-implemented method of claim 2, wherein the first verification structure comprises a target component;
   wherein the first physical measurement is a measurement of a physical characteristic of the target component;
   wherein when the first wafer is in the fabrication state, the target component has first visibility;
   wherein when the first wafer is in the post-fabrication state, the target component has a second visibility; and
   wherein the second visibility is less than the first visibility.

4. The computer-implemented method of claim 1, wherein the first physical measurement is selected from the group consisting of a thickness of an insulator material, a width of a conductor, and a distance between a first conductor and a second conductor.

5. The computer-implemented method of claim 1, further comprising:
   determining, based on the comparing the physical parameter value to the first physical measurement, that the physical parameter value does not match the first physical measurement,
   wherein in response to the determining that the physical parameter value does not match the first physical measurement, the generating the verification response comprises indicating that the received wafer is not the first wafer.

6. The computer-implemented method of claim 1, wherein the first reference image depicts a first reference fabrication layer of the first wafer;
   wherein the first image depicts a first fabrication layer of the first wafer; and
   wherein the comparing the first image to the first reference image comprises comparing the first fabrication layer to the first reference fabrication layer.

7. The computer-implemented method of claim 6, further comprising:
   obtaining a second image of the first wafer in the fabrication state,
   wherein the second image depicts the first fabrication layer and a second fabrication layer of the first wafer;
   obtaining a second reference image of the first wafer;

wherein the second reference image depicts the first reference fabrication layer and a second reference fabrication layer of the first wafer; and determining, by comparing the second image to the second reference image, that the second image matches the second reference image.

8. A system comprising:

one or more processors; and one or more computer-readable storage media storing program instructions which, when executed by the one or more processors, are configured to cause the one or more processors to perform a method comprising:

obtaining a first reference image of a first wafer;

obtaining a first image of the first wafer in a fabrication state, wherein in the fabrication state, the first wafer has a number of fabrication layers that is less than a threshold number;

wherein the first wafer has a first verification structure;

obtaining, when the first wafer is in the fabrication state, a first physical measurement corresponding to the first verification structure;

determining, at a first time, by comparing the first image to the first reference image, that the first image matches the first reference image;

obtaining, at a second time subsequent to the first time, an electrical parameter measurement corresponding to a verification structure of a received wafer in a post-fabrication state;

wherein in the post-fabrication state, the received wafer has a second number of fabrication layers that is equal to the threshold number;

calculating a physical parameter value based on the electrical parameter measurement; and generating a verification response by comparing the physical parameter value to the first physical measurement.

9. The system of claim 8, the method further comprising:

determining, based on the comparing the physical parameter value to the first physical measurement, that the physical parameter value matches the first physical measurement, wherein in response to the determining that the physical parameter value matches the first physical measurement, the generating the verification response comprises indicating that the received wafer is the first wafer in the post-fabrication state, wherein in the post-fabrication state, the first wafer has the second number of fabrication layers that is equal to the threshold number.

10. The system of claim 9, wherein the first verification structure comprises a target component;

wherein the first physical measurement is a measurement of a physical characteristic of the target component;

wherein when the first wafer is in the fabrication state, the target component has first visibility;

wherein when the first wafer is in the post-fabrication state, the target component has a second visibility; and wherein the second visibility is less than the first visibility.

11. The system of claim 8, wherein the first physical measurement is selected from the group consisting of a thickness of an insulator material, a width of a conductor, and a distance between a first conductor and a second conductor.

12. The system of claim 8, the method further comprising:

determining, based on the comparing the physical parameter value to the first physical measurement, that the physical parameter value does not match the first physical measurement, wherein in response to the determining that the physical parameter value does not match the first physical measurement, the generating the verification response comprises indicating that the received wafer is not the first wafer.

13. The system of claim 8, wherein the first reference image depicts a first reference fabrication layer of the first wafer;

wherein the first image depicts a first fabrication layer of the first wafer; and wherein the comparing the first image to the first reference image comprises comparing the first fabrication layer to the first reference fabrication layer.

14. A computer program product comprising one or more computer readable storage media, and program instructions collectively stored on the one or more computer readable storage media, the program instructions comprising instructions configured to cause one or more processors to perform a method comprising:

obtaining a first reference image of a first wafer;

obtaining a first image of the first wafer in a fabrication state, wherein in the fabrication state, the first wafer has a number of fabrication layers that is less than a threshold number;

wherein the first wafer has a first verification structure;

obtaining, when the first wafer is in the fabrication state, a first physical measurement corresponding to the first verification structure;

determining, at a first time, by comparing the first image to the first reference image, that the first image matches the first reference image;

obtaining, at a second time subsequent to the first time, an electrical parameter measurement corresponding to a verification structure of a received wafer in a post-fabrication state;

wherein in the post-fabrication state, the received wafer has a second number of fabrication layers that is equal to the threshold number;

calculating a physical parameter value based on the electrical parameter measurement; and generating a verification response by comparing the physical parameter value to the first physical measurement.

15. The computer program product of claim 14, the method further comprising:

determining, based on the comparing the physical parameter value to the first physical measurement, that the physical parameter value matches the first physical measurement, wherein in response to the determining that the physical parameter value matches the first physical measurement, the generating the verification response comprises indicating that the received wafer is the first wafer in the post-fabrication state, wherein in the post-fabrication state, the first wafer has the second number of fabrication layers that is equal to the threshold number.

16. The computer program product of claim 15, wherein the first verification structure comprises a target component;

wherein the first physical measurement is a measurement of a physical characteristic of the target component;

wherein when the first wafer is in the fabrication state, the target component has first visibility;

wherein when the first wafer is in the post-fabrication state, the target component has a second visibility; and wherein the second visibility is less than the first visibility.

17. The computer program product of claim 14, wherein the first physical measurement is selected from the group consisting of a thickness of an insulator material, a width of a conductor, and a distance between a first conductor and a second conductor.

18. The computer program product of claim 14, the method further comprising:

determining, based on the comparing the physical parameter value to the first physical measurement, that the physical parameter value does not match the first physical measurement, wherein in response to the determining that the physical parameter value does not match the first physical measurement, the generating the verification response comprises indicating that the received wafer is not the first wafer.

19. The computer program product of claim 14, wherein the first reference image depicts a first reference fabrication layer of the first wafer;

wherein the first image depicts a first fabrication layer of the first wafer; and wherein the comparing the first image to the first reference image comprises comparing the first fabrication layer to the first reference fabrication layer.

20. A computer-implemented method comprising:

obtaining a first physical measurement corresponding to a first verification structure of a first wafer in a fabrication state, wherein in the fabrication state, the first wafer has a number of fabrication layers that is less than a threshold number, obtaining an electrical parameter measurement corresponding to a verification structure of a received wafer in a post-fabrication state, wherein in the post-fabrication state, the received wafer has a second number of fabrication layers that is equal to the threshold number, calculating a physical parameter value based on the electrical parameter measurement; and generating a verification response by comparing the physical parameter value to the first physical measurement.

21. A device comprising:

a wafer having a first verification structure in a first region of the wafer and a second verification structure in a second region of the wafer, wherein the first verification structure comprises a first target component and the second verification structure comprises a second target component, and wherein the first verification structure has a first measurable electrical parameter that corresponds to a first physical characteristic of the first target component and the second verification structure has a second measurable electrical parameter that corresponds to a second physical characteristic of the second target component; and wherein a first physical measurement of the first target component that corresponds to the first measurable electrical parameter, and a second physical measurement of the second target component that corresponds to the second measurable electrical parameter, together form a unique identifier of the wafer.

22. The device of claim 21, wherein the wafer comprises a first fabrication layer and a second fabrication layer, the second fabrication layer formed above the first fabrication layer, wherein the first target component is included in the first fabrication layer, wherein the first verification structure further comprises a first pair of pads, the first pair of pads included in the second fabrication layer, and wherein the first measurable electrical parameter is measurable through the first pair of pads.

23. The device of claim 22, wherein the wafer further comprises a third fabrication layer, the third fabrication layer formed above the first fabrication layer, the second fabrication layer formed above the third fabrication layer, wherein the second target component is included in the third fabrication layer, wherein the second verification structure further comprises a second pair of pads, the second pair of pads included in the second fabrication layer, and wherein the second measurable electrical parameter is measurable through the second pair of pads.

24. The device of claim 21, wherein the first target component is an insulator, wherein the first measurable electrical parameter is a capacitance, wherein the first physical characteristic is a thickness, wherein the second target component is a conductor, wherein the second measurable electrical parameter is a resistance, and wherein the second physical characteristic is a width.

* * * * *